United States Patent
Ito et al.

(10) Patent No.: US 12,027,790 B2
(45) Date of Patent: Jul. 2, 2024

(54) CONNECTOR SET AND CAP

(71) Applicant: YAMAICHI ELECTRONICS CO., LTD., Tokyo (JP)

(72) Inventors: Toshiyasu Ito, Tokyo (JP); Yosuke Takai, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 212 days.

(21) Appl. No.: 17/559,335

(22) Filed: Dec. 22, 2021

(65) Prior Publication Data

US 2022/0209446 A1 Jun. 30, 2022

(30) Foreign Application Priority Data

Dec. 24, 2020 (CN) .......................... 202011549516.3

(51) Int. Cl.
*H01R 12/71* (2011.01)
*H01R 12/70* (2011.01)

(52) U.S. Cl.
CPC ......... *H01R 12/716* (2013.01); *H01R 12/707* (2013.01)

(58) Field of Classification Search
CPC .............. H01R 12/7082; H01R 12/716; H01R 13/6461; H01R 43/0256; H01R 13/64; H01R 12/73; H01R 24/00; H01R 12/91; H01R 13/502; H01R 13/6315
See application file for complete search history.

(56) References Cited

U.S. PATENT DOCUMENTS

| | | | | |
|---|---|---|---|---|
| 4,275,944 A * | 6/1981 | Sochor | .................... | H01R 12/89 439/267 |
| 4,993,965 A * | 2/1991 | Eck | .................... | H01R 13/6315 439/248 |
| 5,219,294 A * | 6/1993 | Marsh | ................ | H01R 13/6594 439/79 |
| 5,919,051 A * | 7/1999 | Mitra | .................... | H01R 12/716 439/74 |
| 6,079,991 A * | 6/2000 | Lemke | ................ | H01R 12/716 439/83 |
| 7,476,110 B2 * | 1/2009 | Lemke | ................ | H01R 12/716 439/876 |
| 8,353,726 B2 * | 1/2013 | Zhang | .................. | H01R 13/659 439/637 |
| 8,425,236 B2 * | 4/2013 | Cipolla | .................. | H05K 1/144 439/59 |
| 9,543,703 B2 * | 1/2017 | Horchler | ................ | H01R 13/05 |
| 10,396,481 B2 * | 8/2019 | Lauermann | .......... | H01R 12/716 |

(Continued)

FOREIGN PATENT DOCUMENTS

JP 2018-113146 A 7/2018

*Primary Examiner* — Abdullah A Riyami
*Assistant Examiner* — Nelson R. Burgos-Guntin
(74) *Attorney, Agent, or Firm* — Hayes Soloway PC

(57) ABSTRACT

A connector set is provided that includes a first connector, a first cap to be attached to the first connector when the first connector is reflow-mounted on a first external substrate, a second connector, and a second cap to be attached to the second connector when the second connector is reflow-mounted on a second external substrate formed of a material with a smaller thermal expansion coefficient than that of the first external substrate. The second cap is formed of a material with a smaller thermal expansion coefficient than that of the first cap.

10 Claims, 11 Drawing Sheets

(56) References Cited

U.S. PATENT DOCUMENTS

| | | | |
|---|---|---|---|
| 10,511,127 B2* | 12/2019 | Chang | H05K 1/117 |
| 2002/0146926 A1* | 10/2002 | Fogg | H01R 13/621 |
| | | | 439/660 |
| 2005/0287839 A1* | 12/2005 | Wang | H01R 13/6461 |
| | | | 439/74 |
| 2009/0247014 A1* | 10/2009 | Si | H01R 13/658 |
| | | | 439/607.58 |
| 2010/0304584 A1 | 12/2010 | Miyazaki et al. | |
| 2012/0295453 A1* | 11/2012 | Cipolla | H05K 1/144 |
| | | | 174/257 |
| 2016/0172803 A1* | 6/2016 | Tamai | H01R 12/716 |
| | | | 439/676 |
| 2017/0317440 A1* | 11/2017 | Lauermann | H01R 12/716 |
| 2021/0234315 A1* | 7/2021 | Ellison | H01R 13/6477 |
| 2022/0209443 A1* | 6/2022 | Ito | H01R 12/73 |
| 2022/0209445 A1* | 6/2022 | Ito | H01R 43/0263 |
| 2022/0209446 A1* | 6/2022 | Ito | H01R 12/707 |

* cited by examiner

US 12,027,790 B2

CONNECTOR SET AND CAP

CROSS-REFERENCE TO RELATED APPLICATION

This application claims priority to Chinese patent application CN202011549516.3, filed on Dec. 24, 2020, the contents of which are incorporated by reference herein.

TECHNICAL FIELD

The present disclosure relates to a high-speed transmission connector to be mounted on a circuit board, in particular, to a mezzanine connector that electrically connects different circuit boards.

BACKGROUND

Among connectors for mediating high-speed transmission of signals between a circuit board and an expansion board, there is a type of connector in which the connector mounted on the circuit board side is a socket type, the connector mounted on the expansion board side is a plug type, and the terminals of both connectors are electrically connected by fitting the plug type connector to the frontage of the socket type connector. As an example, this type of connector is called mezzanine connector.

As an example of documents disclosing a technique related to this type of connector, Japanese Patent Application Publication No. 2018-113146 (hereinafter referred to as "Patent Document 1") can be taken up. The connector described in this document has a box-shaped housing and contacts arranged side by side on its wall surface. The bottom surface of the housing of this connector is provided with a boss inserted into a positioning hole in a circuit board, and contacts are provided at the frontage on the side opposite to the side with the boss in the housing. The reflow mounting of this type of connector on a board is performed by placing the connector at a predetermined position on the board with the cap attached, raising the temperature from ordinary temperature to about 260 degrees to melt the solder, and returning it to ordinary temperature.

The problem with this type of mezzanine connector is that when the difference between the thermal expansion coefficient of the material of the circuit board on which the socket type connector is mounted, and the thermal expansion coefficient of the material of the circuit board on which the plug type connector is mounted is large, mounting position deviation of the socket type connector and the plug type connector becomes larger after reflow.

The present disclosure has been made in view of such a problem, and one of the objects is to absorb the difference between the thermal expansion coefficient of the material of the circuit board on which the socket type connector is mounted and the thermal expansion coefficient of the material of the circuit board on which the plug type connector is mounted, and reduce the mounting position error.

SUMMARY

In accordance with a first aspect of the present disclosure, there is provided a connector set including: a first connector; a first cap to be attached to the first connector when the first connector is reflow-mounted on a first external substrate; a second connector; and a second cap to be attached to the second connector when the second connector is reflow-mounted on a second external substrate formed of a material with a smaller thermal expansion coefficient than that of the first external substrate, wherein the second cap is formed of a material with a smaller thermal expansion coefficient than that of the first cap.

In accordance with a second aspect of the present disclosure, there is provided a connector set including: a first connector; a first cap to be attached to the first connector when the first connector is reflow-mounted on a first external substrate; a second connector; and a second cap to be attached to the second connector when the second connector is reflow-mounted on a second external substrate formed of a material with a smaller thermal expansion coefficient than that of the first external substrate, the first cap and the second cap are formed of different materials in such a manner that a mounting position error is less than 0.15 mm when the first cap is reflow-mounted on the first external substrate and the second cap is reflow-mounted on the second external substrate.

In accordance with a third aspect of the present disclosure, there is provided a cap including: a first cap to be attached to a first connector when the first connector is reflow-mounted on a first external substrate; a second connector; and a second cap to be attached to the second connector when the second connector is reflow-mounted on a second external substrate formed of a material with a smaller thermal expansion coefficient than that of the first external substrate, wherein the second cap is formed of a material with a smaller thermal expansion coefficient than that of the first cap.

DETAILED DESCRIPTION

Figure 1:
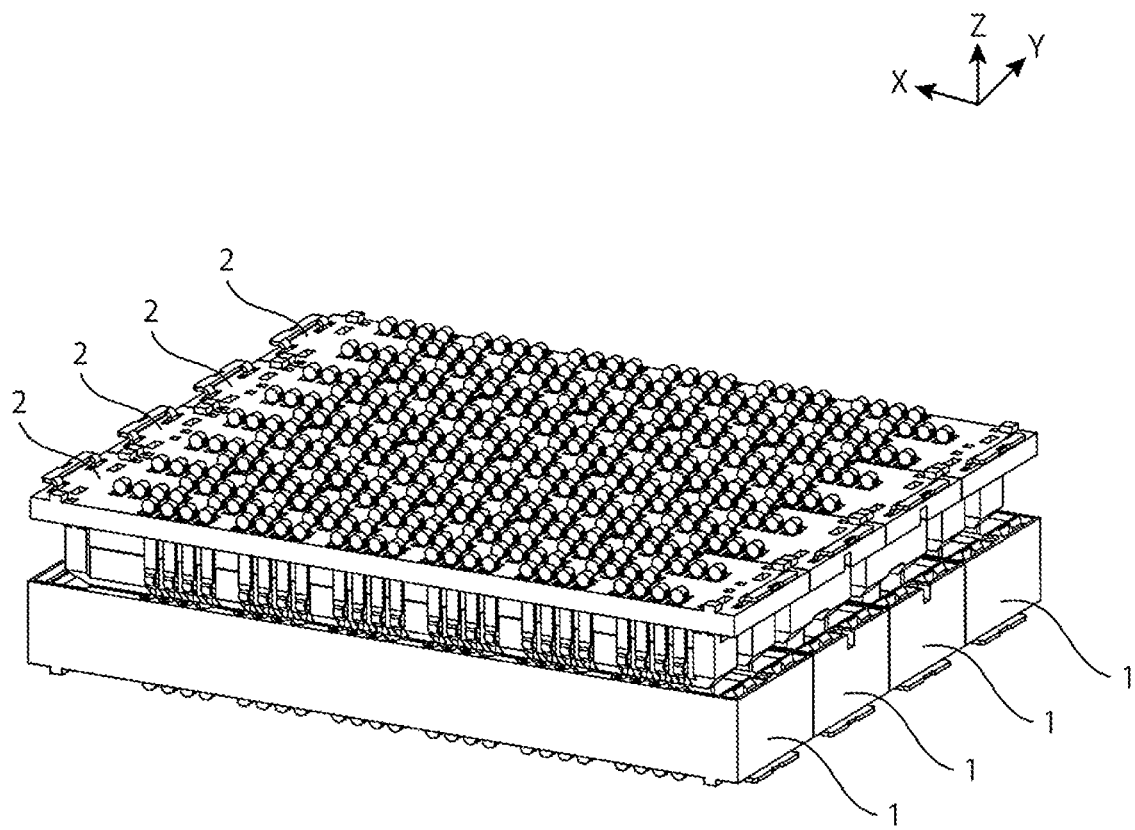
FIG. 1 is a perspective view of socket type connectors and plug type connectors, according to an embodiment of the present disclosure.

Hereafter, a socket type connector 1, a plug type connector 2, a first cap 100, and a second cap 200 that form a connector set according to one embodiment of the present disclosure will be explained with reference to drawings. A plurality of (four in the example of FIG. 1) socket type connectors 1 and plug type connectors 2 are arranged side by side, and are respectively mounted on a first substrate 51 and a second substrate 52. The second substrate 52 is formed of a material with a lower thermal expansion coefficient than that of the first substrate 51. For example, the material of the first substrate 51 is FR4 (Flame Retardant Type 4), and the material of the second substrate 52 is ceramic.

When headers 29 of the plug type connectors 2 on the second substrate 52 are fitted into slots 19 of the socket type connectors 1 on the first substrate 51, the contacts 8 of the socket type connectors 1 are electronically connected to the contacts 8 of the plug type connector 2, and high speed differential transmission based on PAM (Pulse Amplitude Modulation) becomes possible.

The first cap 100 is attached to the socket type connectors 1 when the socket type connectors 1 are reflow-mounted on the first substrate 51. The second cap 200 is attached to the plug type connectors 2 when the plug type connectors 2 are reflow-mounted on the second substrate 52.

In the following description, the fitting direction of the plug type connector 2 to the socket type connector 1 is appropriately referred to as the Z direction, the direction orthogonal to the Z direction is appropriately referred to as the X direction, and the direction orthogonal to the Z direction and the X direction is appropriately referred to as the Y direction. In addition, the +Z side may be referred to as an upper side, the −Z side may be referred to as a lower side, the +X side may be referred to as a front side, the −X side may be referred to as a rear side, the +Y side may be referred to as a left side, and the −Y side may be referred to as a right side.

Figure 4:
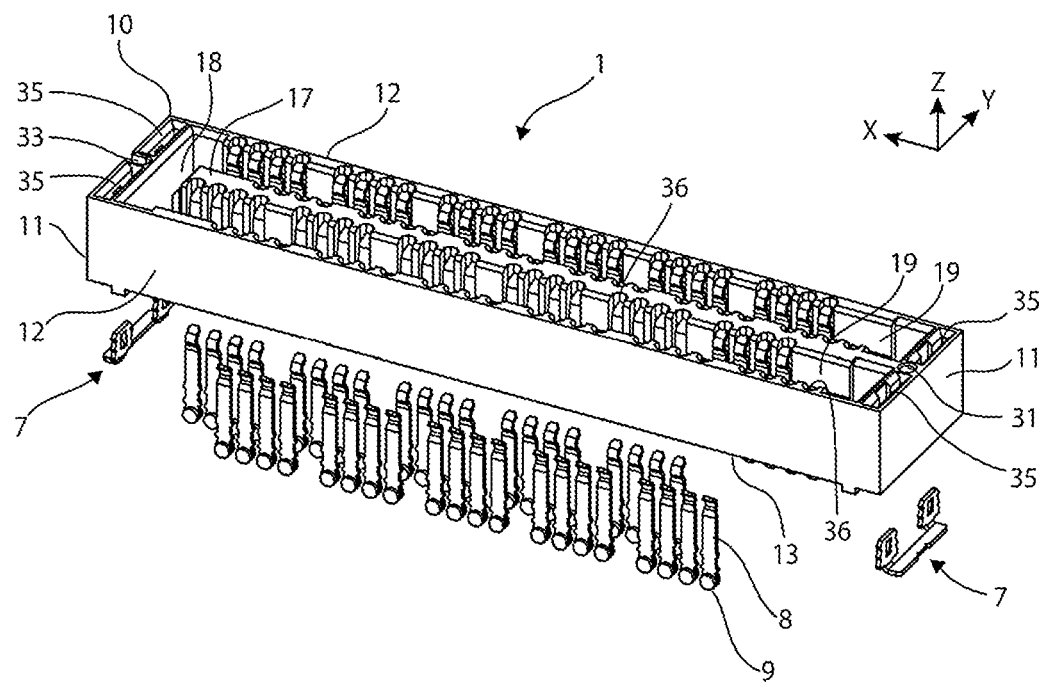
FIG. 4 is an exploded view of the socket type connector of FIG. 2B.
Figure 5:
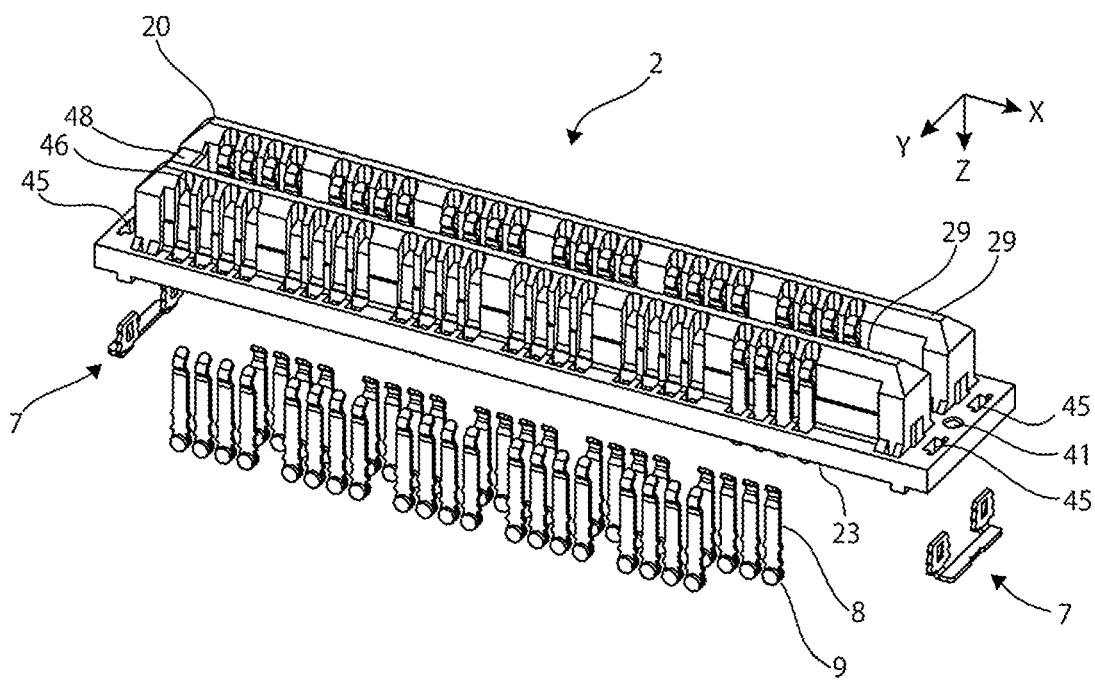
FIG. 5 is an exploded view of the plug type connector of FIG. 3B.
Figure 6:
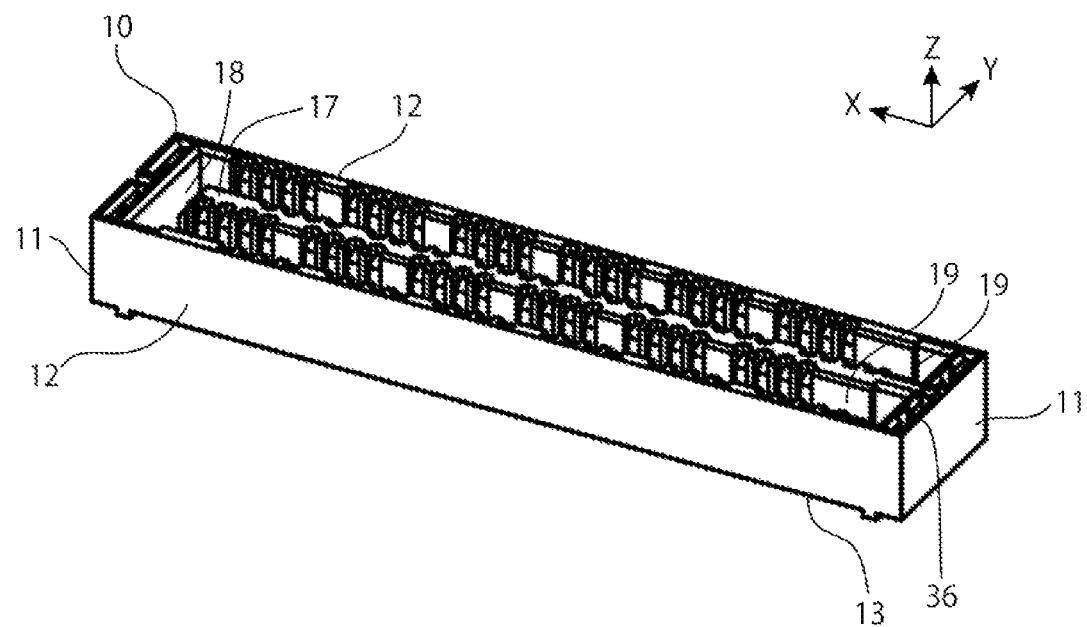
FIG. 6 is a perspective view of a first housing of the socket type connector of FIG. 4.

As shown in FIG. 4, the socket type connector 1 has a first housing 10, solder tab terminals 7 and contacts 8. As shown in FIG. 5, the plug type connector 2 has a second housing 20, solder tab terminals 7 and contacts 8. The first housing 10 of the socket type connector 1 and the second housing 20 of the plug type connector 2 are formed by injecting resin in the X direction which is the longitudinal direction. The first housing 10 of the socket type connector 1 and the second housing 20 of the plug type connector 2 have a rotationally asymmetrical shape. In the present disclosure, the socket type connector 1 corresponds to, for example, the first connector defined in claims and the plug type connector 2 corresponds to, for example, the second connector defined in claims.

More specifically, the first housing 10 of the socket type connector 1 is provided with two slots 19. The two slots 19 extend in the X direction. The first housing 10 has a bottom portion 13 that becomes the bottom of the housing 10, wall portions 11 and wall portions 12 respectively facing each other in the X direction and the Y direction so as to surround the slots 19, and a partition wall 17 separating the two slots 19 in a frontage surrounded by the wall portions 11 and the wall portions 12. The wall portions 11 extend in the Y direction, and the wall portions 12 extend in the X direction. In the present disclosure, the wall portions 11 and the wall portions 12 correspond to, for example, the first wall portions and the second wall portions that are defined in claims, respectively.

The end portion of the partition wall 17 on the −X side is connected to the wall portion 11 on the −X side. The end portion of the partition wall 17 on the +X side is not connected to the wall portion 11 on the +X side, and a gap 18 is formed between the end portion of the partition wall 17 on the +X side and the wall portion 11 on the +X side.

Figure 8:
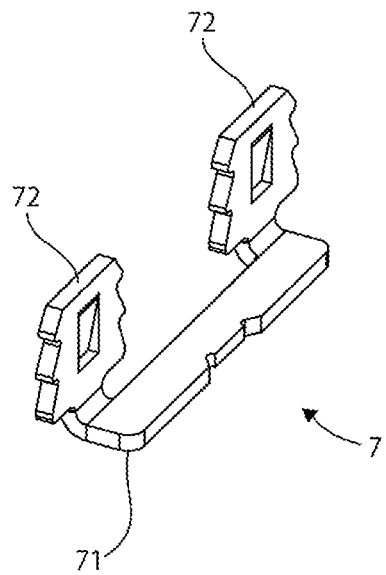
FIG. 8 is a perspective view of a solder tab terminal of the socket type connector of FIG. 4 and the plug type connector of FIG. 5.

A round hole 31 is provided in the middle of the wall portion 11 on the −X side in the Y direction. A long hole 33 is provided in the middle of the wall portion 11 on the +X side in the Y direction. The +X side of the long hole 33 is open. Rectangular grooves 35 are provided on the +Y side and the −Y side of the holes in the wall portion 11 on the −X side and the wall portion 11 on the +X side. The rectangular grooves 35 are recessed from the upper surfaces of the wall portions 11 toward the bottom portion 13. Holes are perforated at the bottoms of the rectangular grooves 35, and the solder tab terminals 7 are fitted and fixed in the holes. As shown in FIG. 8, the solder tab terminal 7 has an elongated substrate portion 71 and two projecting piece portions 72 rising from two end portions of one long side of the substrate portion 71. The two projecting piece portions 72 are fitted into the holes at the bottom of the rectangular groove 35 of the first housing 10.

Figure 14:
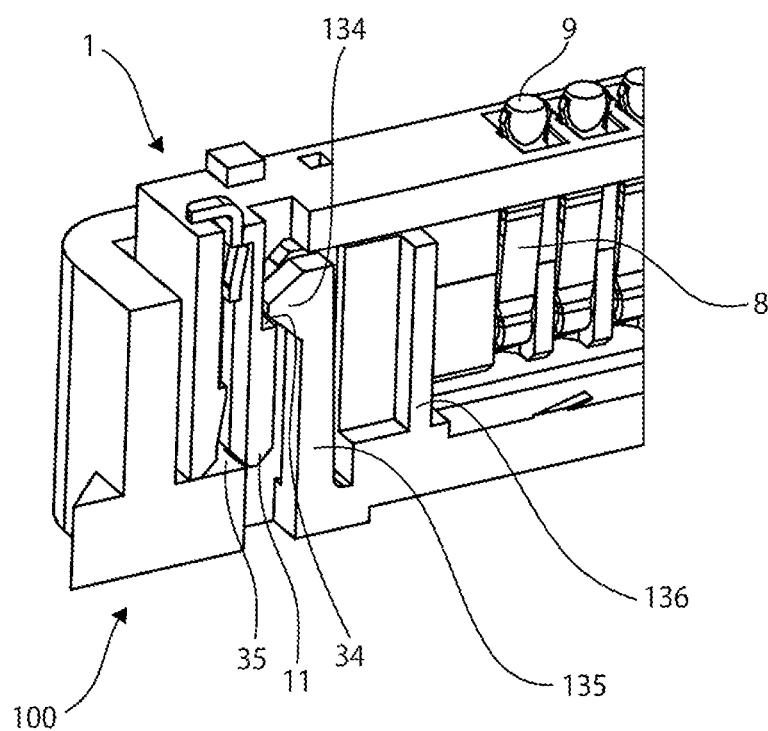
FIG. 14 is a sectional view of a cut surface parallel to the XZ plane, while the first cap is attached to the socket type connector.

As shown in FIG. 14, on the lower sides of the inner surfaces of the wall portions 11 on the +X side and the −X side on the slots 19 sides, there are engaging pieces 34 projecting to the slots 19 sides.

Figure 9:
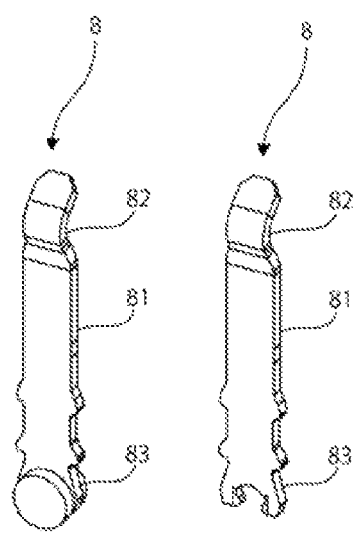
FIG. 9 is a perspective view of contacts of the socket type connector of FIG. 4 and the plug type connector of FIG. 5.

Grooves 36 are provided in the inner surfaces of the wall portions 12 and the side surfaces of the partition wall 17. Contacts 8 are accommodated in the grooves 36. As shown in FIG. 9, the contact 8 has a linear portion 81 extending in one direction, a terminal portion 82 at one end of the linear portion 81, and a fork portion 83 at the other end of the linear portion 81. The terminal portion 82 is bent into a doglegged shape. The fork portion 83 is bifurcated. Solder 9 is caulked and fixed to the fork portion 83. The contact 8 is held in the grooves 36 of the wall portion 12 and the partition wall 17, and the fork portion 83 of the contact 8 and the solder 9 are exposed to the opposite side to the groove 36 side through the hole in the bottom portion 13.

Figure 2A:
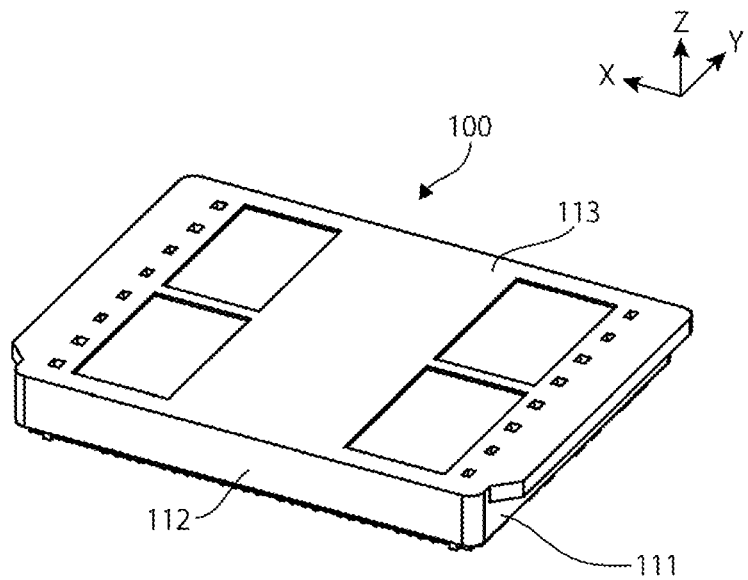
FIG. 2A is a perspective view of a first cap to be attached to the socket type connectors.
Figure 2B:
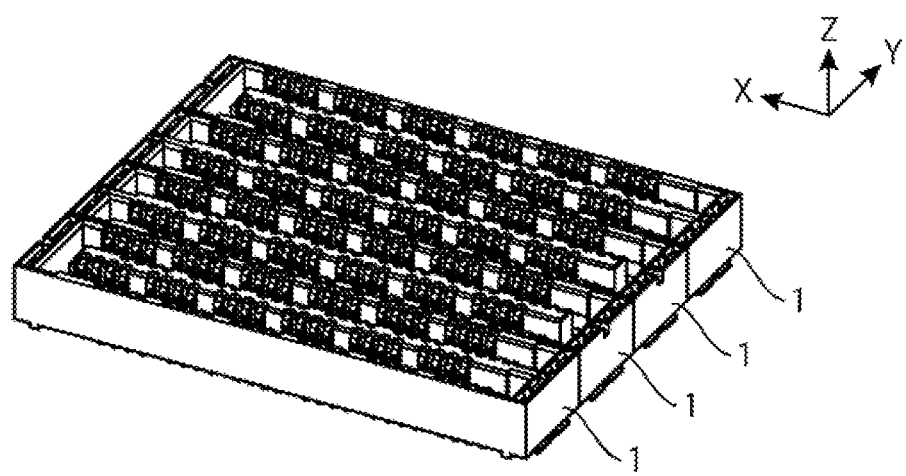
FIG. 2B is a perspective view of the socket type connectors 1 of FIG. 1.
Figure 10:
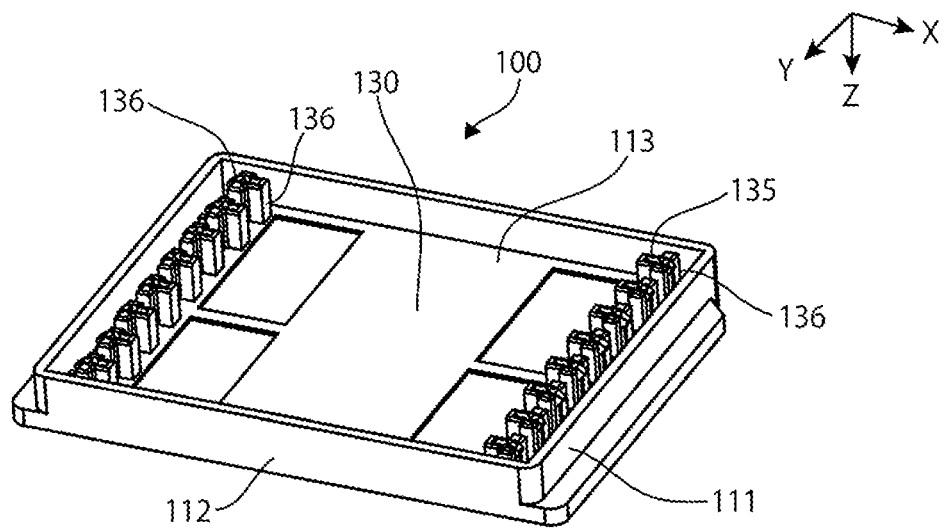
FIG. 10 is a perspective view of the first cap of FIG. 2A as viewed from an opposite side.

As shown in FIG. 2A and FIG. 10, the first cap 100 has a box shape with a width in the X direction and the Y direction slightly larger than that of four socket type connectors 1 arranged side by side. A first opening 130 for accommodating and holding the socket type connectors 1 is provided on the −Z side of the first cap 100. The first cap 100 has a top plate portion 113 that constitutes a ceiling of the first cap 100, wall portions 111 and wall portions 112 respectively facing each other in the X direction and the Y direction across the first opening 130.

A hooking spring 135 and a spring accommodation portion 136 are provided at a position corresponding to each slot 19 of four first housings 10 inside the wall portion 112 on the −X side and the wall portion 112 on the +X side. As shown in FIG. 14, the lower end portion 134 of the hooking spring 135 projects outward in a triangular shape.

A positioning pin is provided at a position corresponding to the round hole 31 between the adjacent spring accommodation portions 136 inside the wall portion 112 on the −X side. The positioning pin has a shape to be put in the round hole 31. A positioning long pin is provided at a position corresponding to the long hole 33 between the adjacent spring accommodation portions 136 inside the wall portion 112 on the +X side. The positioning long pin has a shape to be put in the long hole 33.

The attachment of the first cap 100 to the socket type connector 1 and the reflow mounting thereof are performed as follows. First, the four socket type connectors 1 are arranged so that the orientation of the gaps 18 of a part of the socket type connectors 1 and the orientation of the gaps 18 of the remaining socket type connectors 1 are reversed (for example, the gaps 18 of two socket type connectors 1 in the middle are on the −X side, and the gaps 18 of two socket type connectors 1 at both ends are on the +X side).

Next, the first cap 100 is attached to the four socket type connectors 1 so that the positioning pins are inserted into the round holes 31 on the −X side, the positioning long pins are inserted into the long holes 33 on the +X side, and the hooking springs 135 are fitted inside the wall portions 11 on the −X side and the +X side. As shown in FIG. 14A and FIG. 14B, when the first cap 100 is attached to the four socket type connectors 1, the lower end portions 134 of the hooking springs 135 of the first cap 100 engage with the engaging pieces 34 of the connectors 1, and the socket type connectors 1 are supported from the inside in the X direction by the hooking springs 135 of the first cap 100.

Next, the four socket type connectors 1 gathered by the first cap 100 are placed on a predetermined position of the first substrate 51, and are put into a reflow device. The temperature in the device is changed from 20° C. to 260° C. to 20° C. When the temperature exceeds 217° C., the solder 9 at the tip end portion of the contact 8 is melted, and when the temperature returns to ordinary temperature, the solder 9 solidifies. The contact 8 of the socket type connector 1 and the pad of the first substrate 51 are connected to each other by the solidification of the solder 9. After the socket type connector 1 is attached to the first substrate 51, the first cap 100 is removed from the socket type connector 1.

Figure 7:
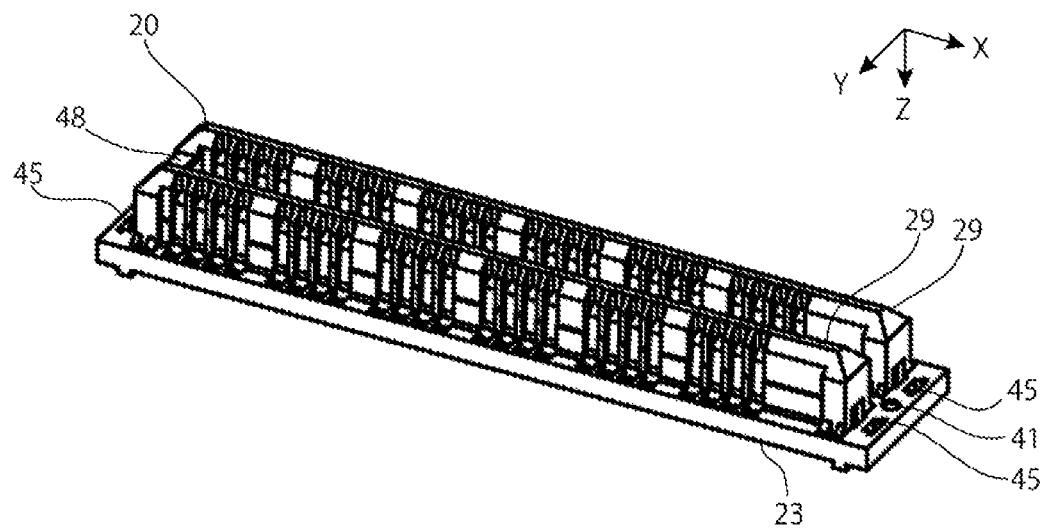
FIG. 7 is a perspective view of a second housing of the plug type connector of FIG. 5.

As shown in FIG. 5 and FIG. 7, the second housing 20 of the plug type connector 2 is provided with two headers 29. The two headers 29 extend in the X direction. The end portions on the −X side, +X side, −Y side, and +Y side of the bottom portion 23 that becomes the bottom of the two headers 29 of the second housing 20 project outside the portion that supports the headers 29. A fitting plate portion 48 is provided between the end portions of two adjacent headers 29 on the −X side in the second housing 20.

A round hole 41 is provided in the middle of the end portion of the bottom portion 23 on the −X side in the Y direction. A second long hole is provided in the middle of the end portion of the bottom portion 23 on the +X side in the Y direction. The +X side of the second long hole is open. Rectangular holes 45 are provided on the +Y side and the −Y side of the holes in the end portions of the bottom portion 23 on the −X side and the +X side. Solder tab terminals 7 are fitted and fixed in the rectangular holes 45.

Grooves 46 are provided in the side surfaces of the two headers 29 on the +Y side and the −Y side. Contacts 8 are accommodated in the grooves 46. The contacts 8 are held in the grooves 46 of the headers 29, and the fork portions 83 of the contacts 8 and solder 9 are exposed on the opposite side to the grooves 46 side through holes in the bottom portion 23.

Figure 3A:
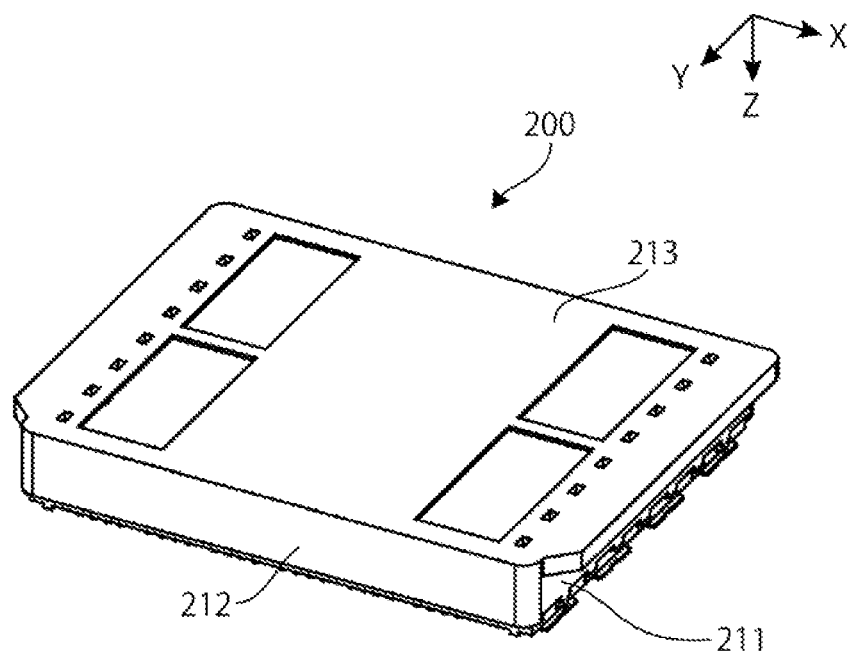
FIG. 3A is a perspective view of a second cap to be attached to the plug type connectors.
Figure 3B:
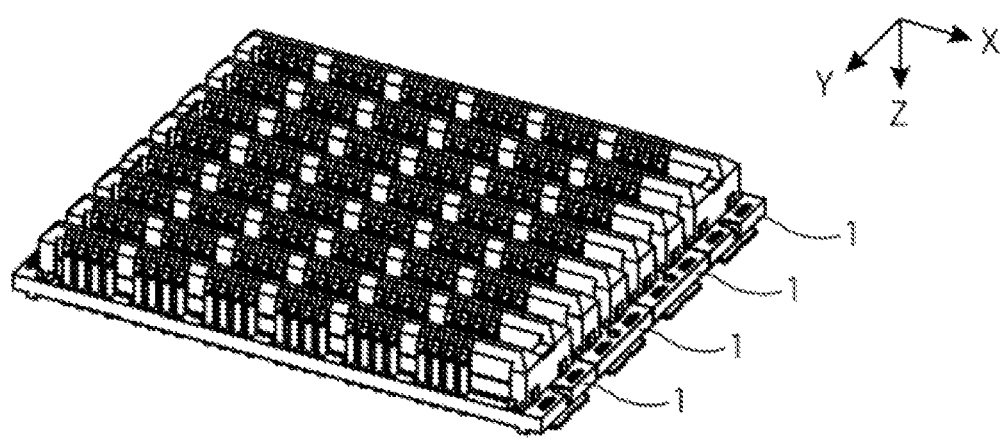
FIG. 3B is a perspective view of the plug type connectors 2 of FIG. 1.
Figure 11:
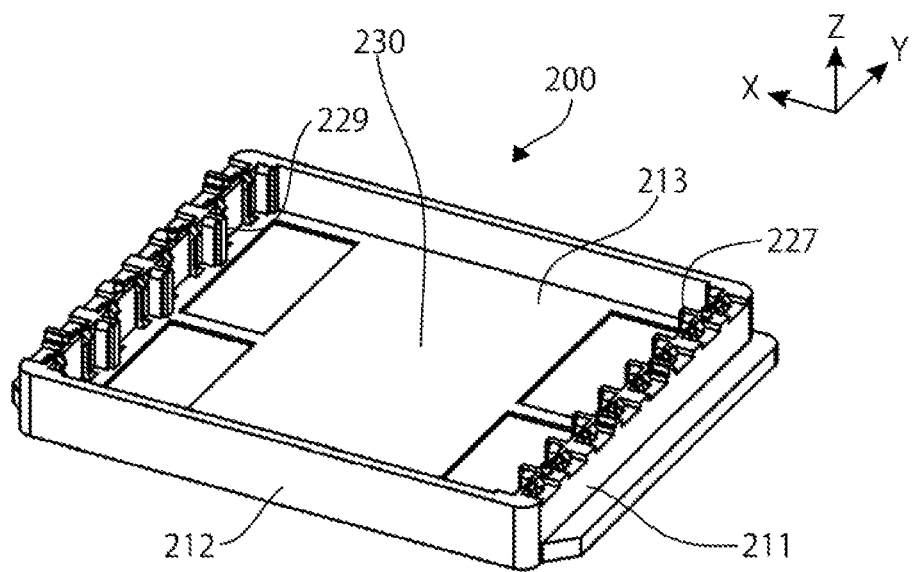
FIG. 11 is a perspective view of the second cap of FIG. 3A as viewed from an opposite side.

As shown in FIG. 3A and FIG. 11, the second cap 200 has a box shape with a width in the X direction and the Y direction slightly larger than that of four plug type connectors 2 arranged side by side. A second opening 230 for accommodating and holding the plug type connectors 2 is provided on the +Z side of the second cap 200. The second cap 200 has a top plate portion 213 that becomes a ceiling of the second cap 200, wall portions 211 and wall portions 212 respectively facing each other in the X direction and the Y direction across the second opening 230.

There are holding piece portions 227, which project inside, at positions corresponding to the gaps between the headers 29 of the second housings 20 on the inner side of the wall portion 211 on the −X side. There are holding piece portions 229, which project inside, at positions corresponding to the gaps between the headers 29 of the second housings 20 on the inner side of the wall portion 211 on the +X side.

Positioning pins are provided at positions corresponding to the round holes 41 of the second housings 20 between the adjacent holding piece portions 227 of the wall portion 211 on the −X side. The positioning pin has a shape to be put in the round hole 41. Positioning long pins are provided at positions corresponding to the second long holes of the second housings 20 between the adjacent holding piece portions 229 of the wall portion 211 on the +X side. The positioning long pin has a shape to be put in the second long hole.

The attachment of the second cap 200 to the plug type connectors 2 and the reflow-mounting thereof are performed as follows. First, the four plug type connectors 2 are arranged so that the combination of the fitting plate portions 48 on one side and the fitting plate portions 48 on the other side fits the gap of the four socket type connectors 1.

Next, the second cap 200 is attached to the four plug type connectors 2 so that the positioning pins are inserted into the round holes 41 on the +X side and the positioning long pins are inserted into the second long holes on the −X side. When the second cap 200 is attached to the four plug type connectors 2, the holding piece portions 227 and 229 of the second cap 200 abut against the headers 29 of the plug type connectors 2, and the four socket type connectors 1 are supported from the outside in the X direction by the holding piece portions 227 and 229 of the second cap 200.

Next, the four plug type connectors 2 gathered by the second cap 200 are placed on a predetermined position of the second substrate 52, and are put into a reflow device. The temperature in the device is changed from 20° C. to 260° C. to 20° C. When the temperature exceeds 217° C., the solder 9 at the tip end portion of the contact 8 is melted, and when the temperature returns to ordinary temperature, the solder 9 solidifies. The contact 8 of the plug type connector 2 and the pad of the second substrate 52 are connected to each other by the solidification of the solder 9. After the plug type connector 2 is attached to the second substrate 52, the second cap 200 is removed from the plug type connector 2.

When the plug type connector 2 and the socket type connector 1 are connected in a correct orientation, the fitting plate portion 48 of the plug type connector 2 is fitted to the gap 18 of the socket type connector 1. When the plug type connector 2 and the socket type connector 1 are connected in an incorrect orientation, the fitting plate portion 48 of the plug type connector 2 interferes with the partition wall 17 of the socket type connector 1. When the plug type connector 2 and the socket type connector 1 are oriented in opposite directions, the fitting plate portion 48 and the partition wall 17 interfere with each other, so that reverse insertion of plug type connector 2 and the socket type connector 1 is prevented.

Figure 12A:
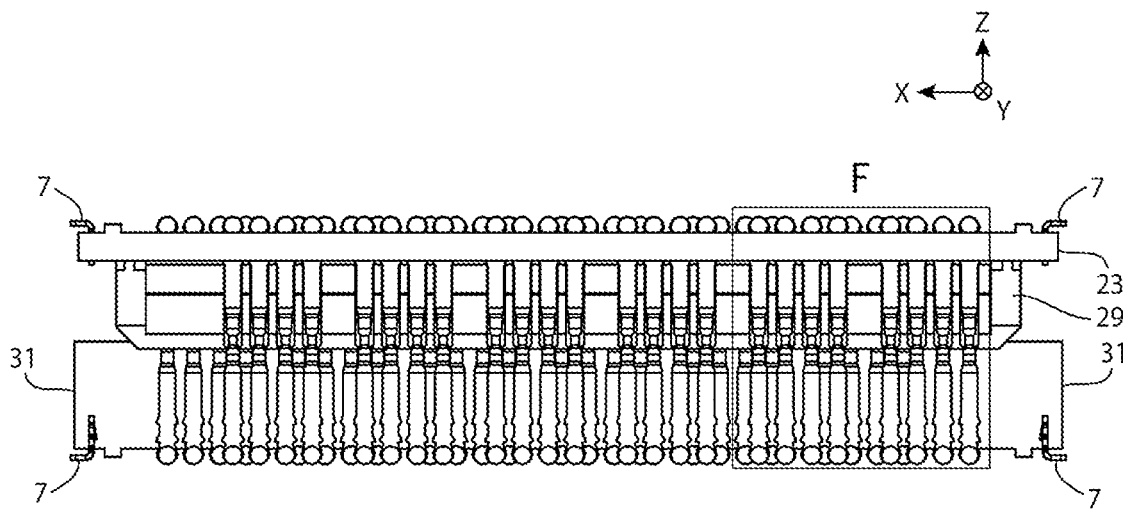
FIG. 12A is a line sectional view of a cut surface parallel to the XZ plane of FIG. 1.
Figure 12B:
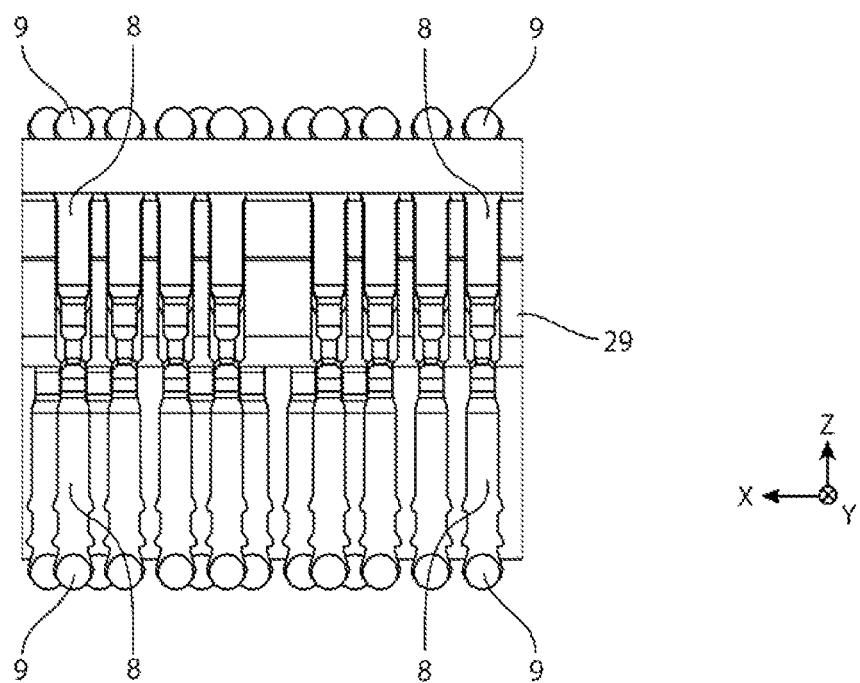
FIG. 12B is an enlarged view inside the F frame of FIG. 12A.
Figure 13A:
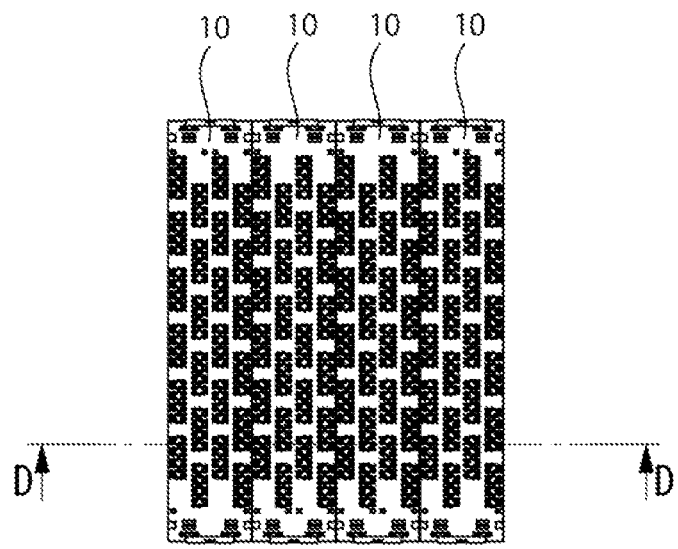
FIG. 13A is a diagram of FIG. 1 as viewed from the −Z side.
Figure 13B:
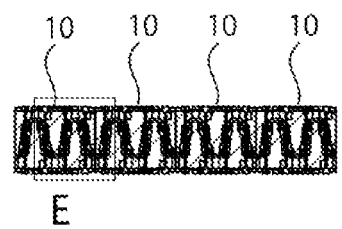
FIG. 13B is a sectional view taken along line D-D.
Figure 13C:
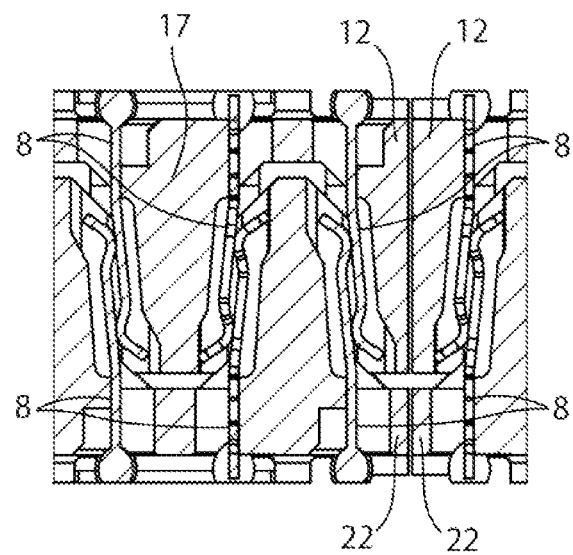
FIG. 13C is an enlarged view inside the E frame of FIG. 13B.

As shown in FIG. 13B and FIG. 13C, when the plug type connector 2 and the socket type connector 1 are connected in the correct orientation, the contacts 8 of the plug type connector 2 and the contacts 8 of the socket type connector 1 come into contact with each other. Further, as shown in FIG. 12A and FIG. 12B, among the contacts 8 disposed oppositely on both sides of each of the header 29 and the slot 19, the position of the contact on the −Y side and the position of the contact 8 on the +Y side are shifted in the X direction by ½ contact. The reason why the position of the contact 8 on the −Y side and the position of the contact 8 on the +Y side are shifted in the X direction by ½ contact is to effectively prevent crosstalk.

Here, the first cap 100 and the second cap 200 are formed of different materials. The thermal expansion coefficient of the material of the second cap 200 is smaller than the thermal expansion coefficient of the material of the first cap 100. More specifically, when the thermal expansion coefficient of the first cap 100 in the Y direction, which is the arranging direction of the four socket type connectors 1, is $\alpha 11$, the thermal expansion coefficient of the first substrate 51 in the Y direction is $\alpha 10$, the thermal expansion coefficient of the second cap 200 in the Y direction is $\alpha 21$, and the thermal expansion coefficient of the second substrate 52 in the Y direction is $\alpha 20$, $\alpha 11/\alpha 10 \approx \alpha 21/\alpha 20$. This is to settle the difference between the mounting position of the contact 8 of the socket type connector 1 on the first substrate 51 and the mounting position of the contact 8 of the plug type connector 2 on the second substrate 52 to be less than 0.15 mm.

The reason why the mounting position error of the socket type connector 1 and the plug type connector 2 can be reduced by setting the thermal expansion coefficient of the second cap 200 smaller than the thermal expansion coefficient of the first cap 100 is as follows.

Figure 15:
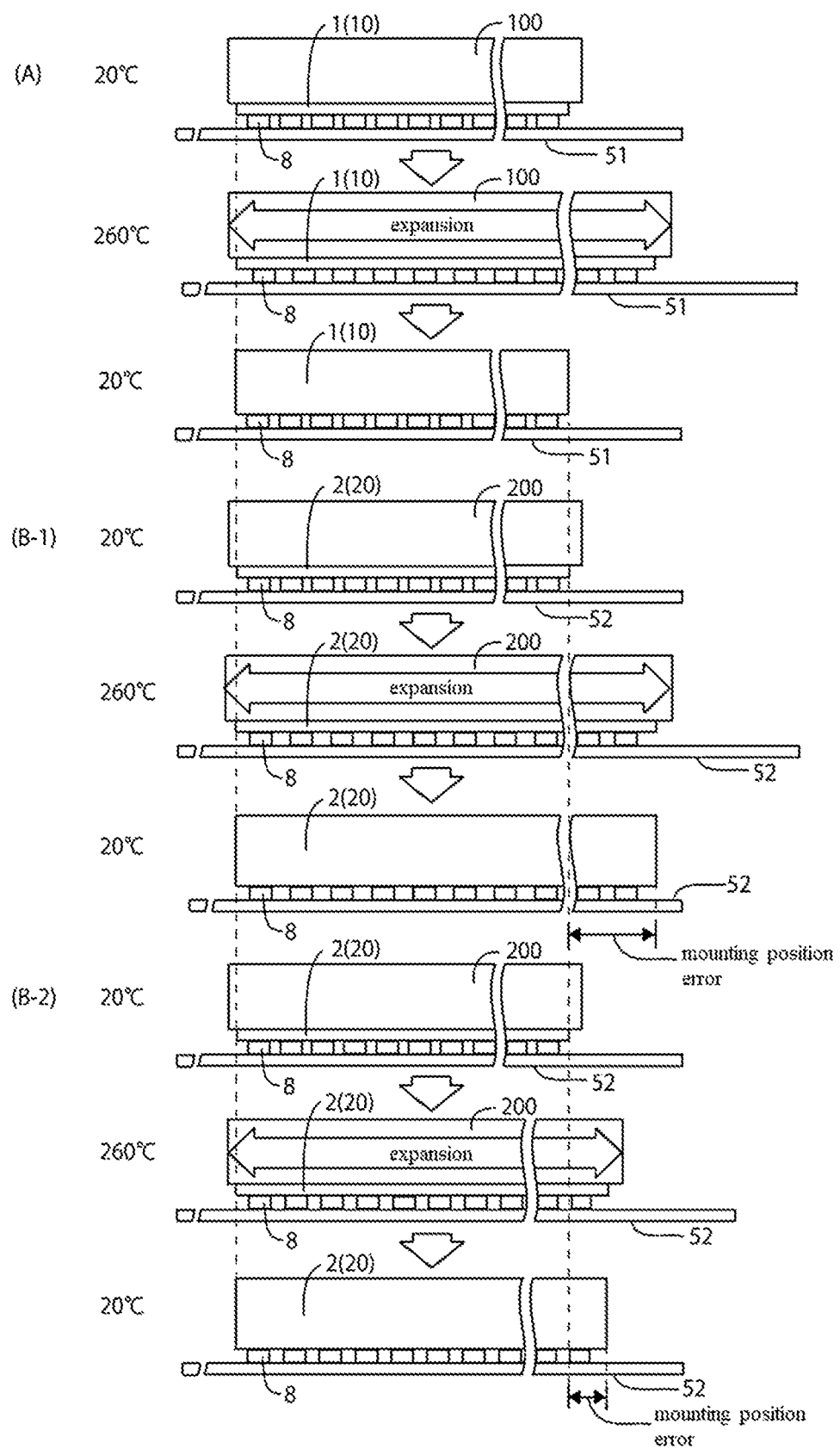
FIG. 15 is a diagram showing each state of expansion during reflow of the three types of connectors in the disclosure. Within FIG. 15, (A) shows a state of expansion during reflow of the socket type connector 1, (B-1) shows a state of expansion during reflow of the plug type connector 2 when the thermal expansion coefficient of the socket type connector is almost the same as the thermal expansion coefficient of the material of the plug type connector; and (B-2) shows a state of expansion during reflow of the plug type connector when the thermal expansion coefficient of the material of the plug type connector is smaller than the thermal expansion coefficient of the socket type connector.

As shown in FIGS. 15((A) and (B-1)), in the reflow mounting, the first cap 100, the first housing 10, and the first substrate 51, as well as the second cap 200, the second housing 20, and the second substrate 52 expand in the Y direction when the temperature in the reflow device becomes high, and contract when the temperature returns to ordinary temperature.

With the expansion of the first cap 100, the distance between the adjacent contacts 8 in the first housing 10 of the socket type connector 1 widens, and the positions of the contacts 8 of the socket type connector 1 at the time when temperature exceeds the melting temperature of the solder 9 and reaches 260° C. become the mounting positions of the contacts 8 on the first substrate 51. Similarly, the positions of the contacts 8 of the plug type connector 2 at the time when the temperature reaches 260° C. become the mounting positions of the contacts 8 on the second substrate 52.

As described above, ceramic, which is the material of the second substrate 52, has a smaller thermal expansion coefficient than that of FR4, which is the material of the first substrate 51. For this reason, assuming that the first cap 100 and the second cap 200 are materials with almost the same thermal expansion coefficient as that of the first substrate 51, the first substrate 51 contracts while returning from 260° C. to 20° C., and the interval between the contacts 8 of the socket type connector 1 also returns to the original interval. On the other hand, the second substrate 52 hardly contracts, and the interval between the contacts 8 of the plug type connector 2 remains widened by expansion. As a result, the mounting position error of the socket type connector 1 and the plug type connector 2 becomes large.

In contrast, as shown in FIG. 15(B-2), when the thermal expansion coefficient of the second cap 200 is made smaller than the thermal expansion coefficient of the first cap 100, the interval of the contacts 8 of the plug type connector 2 at the time of reaching 260° C. becomes smaller than that in the state where the thermal expansion coefficients are the same. Accordingly, the mounting position error of the socket type connector 1 and the plug type connector 2 at the time when the temperature returns from 260° C. to 20° C. becomes smaller.

The details of the present embodiment have been explained above. The connector set according to the present embodiment includes: a socket type connector 1; a first cap 100 to be attached to the socket type connector 1 when the socket type connector 1 is reflow-mounted on the first substrate 51; a plug type connector 2; and a second cap 200 to be attached to the plug type connector 2 when the plug type connector 2 is reflow-mounted on the second substrate 52, wherein the second substrate 52 is formed of a material with a smaller thermal expansion coefficient than that of the first substrate 51, and the second cap 200 is formed of a material with a smaller thermal expansion coefficient than that of the first cap 100. Accordingly, it is possible to absorb the difference between the thermal expansion coefficient of the material of the circuit board on which the socket type connector 1 is mounted and the thermal expansion coefficient of the material of the circuit board on which the plug type connector 2 is mounted, and reduce the mounting position error.

Further, the connector according to the present embodiment includes a plurality of socket type connectors 1 to be mounted on a first substrate 51, and a plurality of plug type connectors 2 to be mounted on a second substrate 52. The socket type connector 1 includes a first housing 10 with a slot 19, and a plurality of contact 8 arranged in the slot 19. The plug type connector 2 includes a second housing 20 with a header 29 to be fitted into the slot 19, and a plurality of contacts 8 arranged in the header 29. Then, the first housing 10 of the socket type connector 1 and the second housing 20 of the plug type connector 2 have a rotationally asymmetrical shape as viewed in a fitting direction. Thus, it is possible to provide a connector that is unlikely to cause reverse insertion.

Further, in the present embodiment, the slots 19 of the socket type connector 1 and the headers 29 of the plug type connector 2 are in two rows. For this reason, compared with one row in the conventional connector, it is possible to make it difficult to apply stress to the solder 9.

Although the embodiment of the present disclosure has been described above, the following modifications may be added to this embodiment.
  (1) In the above embodiment, the number of the connectors gathered by the cap and mounted on the substrate may be two to three or four or more.
  (2) In the above embodiment, there may be one or three or more rows of slots 19 in one socket type connector 1, and there may be one or three or more rows of headers 29 in one plug type connector 2.

What is claimed is:

1. A connector set comprising:
a first connector;
a first cap to be attached to the first connector to cover the first connector when the first connector is reflow-mounted on a first external substrate;
a second connector; and
a second cap to be attached to the second connector to cover the second connector when the second connector is reflow-mounted on a second external substrate formed of a material with a smaller thermal expansion coefficient than that of the first external substrate,
wherein the second cap is formed of a material with a smaller thermal expansion coefficient than that of the first cap.

2. A connector set comprising:
a first connector;
a first cap to be attached to the first connector to cover the first connector when the first connector is reflow-mounted on a first external substrate;
a second connector; and
a second cap to be attached to the second connector to cover the second connector when the second connector is reflow-mounted on a second external substrate formed of a material with a smaller thermal expansion coefficient than that of the first external substrate,
wherein the first cap and the second cap are formed of different materials in such a manner that a mounting position error is less than 0.15 mm when the first cap is reflow-mounted on the first external substrate and the second cap is reflow-mounted on the second external substrate.

3. The connector set according to claim 1, wherein:
the first connector comprises:
a first housing with a slot; and
a plurality of contacts arranged in the slot,
the second connector comprises a second housing with a header to be fitted in the slot,
the first connector is arranged in a direction orthogonal to an extending direction of the slot and held by the first cap, and
the second connector is arranged in a direction orthogonal to an extending direction of the header and held by the second cap.

4. The connector set according to claim 3, wherein:
a relation of a ratio $\alpha11/\alpha10$ of a thermal expansion coefficient $\alpha11$ to a thermal expansion coefficient $\alpha10$ and a ratio $\alpha21/\alpha20$ of a thermal expansion coefficient $\alpha21$ to a thermal expansion coefficient $\alpha20$ is $\alpha11/\alpha10 \approx \alpha21/\alpha20$, wherein the thermal expansion coefficient $\alpha11$ is the thermal expansion coefficient of the first cap in an arrangement direction of the first connector,
the thermal expansion coefficient $\alpha10$ is the thermal expansion coefficient of the first external substrate,
the thermal expansion coefficient $\alpha21$ is the thermal expansion coefficient of the second cap in an arrangement direction of the second connector, and
the thermal expansion coefficient $\alpha20$ is the thermal expansion coefficient of the second external substrate.

5. The connector set according to claim 3, wherein a number of the slots in one first connector is two, and a number of the headers in one second connector is two.

6. The connector set according to claim 3, wherein among the contacts respectively disposed on both sides of the slots and the headers, a position of the contact on one side and a position of the contact on the other side are shifted by ½ contact.

7. The connector set according to claim 3, wherein the first housing and the second housing have a rotationally asymmetrical shape as viewed from the fitting direction.

8. The connector set according to claim 7, wherein:
the first housing comprises a bottom portion, first wall portions facing each other in a first direction orthogonal to the fitting direction, and second wall portions facing each other in a second direction orthogonal to the fitting direction and the first direction, so as to surround the slot,
the slot is separated into a plurality of slots by a partition wall extending along the first direction, one end portion of the partition wall is connected to one first wall portion of the two first wall portions on both sides of the first direction, the other end portion of the partition wall is not connected to the other first wall portion, and a gap is formed between the other end portion of the partition wall and the other first wall portion, and
the second housing comprises a plurality of headers, the plurality of headers extend in the first direction, and a fitting plate portion to be fitted in the gap is provided between the adjacent one end portions of the plurality of headers in the first direction.

9. A cap comprising:
a first cap to be attached to a first connector when the first connector is reflow-mounted on a first external substrate;
a second connector; and
a second cap to be attached to the second connector when the second connector is reflow-mounted on a second external substrate formed of a material with a smaller thermal expansion coefficient than that of the first external substrate,
wherein the second cap is formed of a material with a smaller thermal expansion coefficient than that of the first cap.

10. The cap according to claim 9, wherein:
a relation of a ratio $\alpha11/\alpha10$ of a thermal expansion coefficient $\alpha11$ to a thermal expansion coefficient $\alpha10$, and a ratio $\alpha21/\alpha20$ of a thermal expansion coefficient $\alpha21$ to a thermal expansion coefficient $\alpha20$ is $\alpha11/\alpha10 \approx \alpha21/\alpha20$, wherein the thermal expansion coefficient $\alpha11$ is the thermal expansion coefficient of the first cap in an arrangement direction of the first connector,
the thermal expansion coefficient $\alpha10$ is the thermal expansion coefficient of the first external substrate,
the thermal expansion coefficient $\alpha21$ is the thermal expansion coefficient of the second cap in an arrangement direction of the second connector, and
the thermal expansion coefficient $\alpha20$ is the thermal expansion coefficient of the second external substrate.

* * * * *